US007602185B2

(12) United States Patent
Nozaki

(10) Patent No.: US 7,602,185 B2
(45) Date of Patent: Oct. 13, 2009

(54) MAGNETIC RESONANCE IMAGING APPARATUS AND MAGNETIC RESONANCE IMAGING METHOD

(75) Inventor: Seiji Nozaki, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/169,226

(22) Filed: Jul. 8, 2008

(65) Prior Publication Data

US 2009/0015258 A1    Jan. 15, 2009

(30) Foreign Application Priority Data

Jul. 12, 2007    (JP)    ............................. 2007-183556
May 20, 2008    (JP)    ............................. 2008-132177

(51) Int. Cl.
*G01V 3/00* (2006.01)
(52) U.S. Cl. ...................................... 324/315; 324/309
(58) Field of Classification Search ......... 324/300–322; 600/407–455; 128/653.2, 202.13, 200.24; 700/273
See application file for complete search history.

(56) References Cited

U.S. PATENT DOCUMENTS 5,101,638 A * 4/1992 White ........................ 62/51.1
5,423,317 A * 6/1995 Iijima et al. ................. 600/410
6,977,501 B2   12/2005 Kassai et al.
7,339,376 B2 * 3/2008 Liu ............................ 324/318
2006/0047198 A1 * 3/2006 Sugimoto ................... 600/410

FOREIGN PATENT DOCUMENTS

JP    6-292662    10/1994

* cited by examiner

*Primary Examiner*—Brij B Shrivastav
(74) *Attorney, Agent, or Firm*—Nixon & Vanderhye PC

(57) ABSTRACT

A magnetic resonance imaging apparatus performs photographing by magnetic resonance imaging using hardware of which temperature is likely to rise due to a photographing operation. The magnetic resonance imaging apparatus includes an obtaining device, an alert state detecting device, and a control device. The obtaining device obtains information providing an indication of temperature of the hardware during the photographing. The alert state detecting device detects the occurrence of an alert state where the temperature of the hardware is likely to rise enough to affect the photographing, on the basis of the obtained information. The control device controls the photographing so as to suppress temperature rise of the hardware according to the detection of the occurrence of the alert state.

14 Claims, 2 Drawing Sheets

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from prior Japanese Patent Applications No. 2007-183556, filed Jul. 12, 2007; and No. 2008-132177, filed May 20, 2008, the entire contents of both of which are incorporated herein by reference.

BACKGROUND OF THE INVENTION

1. Field of the Invention

The present invention relates to a magnetic resonance imaging apparatus and a magnetic resonance imaging method that perform photographing by magnetic resonance imaging using hardware of which temperature is likely to rise due to a photographing operation, such as a gradient magnetic field coil and a gradient magnetic field amplifier.

2. Description of the Related Art

When diffusion photographing where a large load is applied to a gradient magnetic field is performed in a magnetic resonance imaging apparatus, the temperature of hardware, such as a gradient magnetic field coil and a gradient magnetic field amplifier, considerably rises. There may be a case where photographing cannot be continued due to the temperature rise of the hardware.

There has been known a technique that estimates the change of the amount of residual heat of a gradient magnetic field coil on the basis of a waveform of current supplied to a gradient magnetic field coil according to a temporarily set protocol, and allows an operator to change the protocol on the basis of the estimation so that the amount of residual heat of the gradient magnetic field coil does not exceed an abortion level. (For example, see the specification of U.S. Pat. No. 6,977,501). The specification of U.S. Pat. No. 6,977,501 discloses that the photographing is stopped if the amount of residual heat of the gradient magnetic field coil exceeds the abortion level after the beginning of the photographing.

According to the above-mentioned Techniques the load of the gradient magnetic field coil may be different from an estimated value. In this case, the estimated value of the amount of residual heat of the gradient magnetic field coil is different from a real value of the amount of residual heat. If photographing is performed according to a protocol based on the estimated value when the estimated value is estimated to be small, the amount of residual heat exceeds the abortion level. For this reason, it is highly likely that the photographing is stopped. Further, when the estimated value is estimated to be large, a protocol based on the estimated value is defined to make the hardware have an excessive margin with respect to a limit, which is Inefficient. That is, if estimation accuracy is low, efficient photographing cannot be performed.

BRIEF SUMMARY OF THE INVENTION

Accordingly, there has been a demand for efficient photographing that is accomplished by utilizing hardware in maximum.

According to a first aspect of the invention, a magnetic resonance imaging apparatus performs photographing by magnetic resonance imaging using hardware of which temperature is likely to rise due to a photographing operation. The magnetic resonance imaging apparatus includes an obtaining device, an alert state detecting device, and a control device. The obtaining device obtains information providing an indication of temperature of the hardware during the photographing. The alert state detecting device detects the occurrence of an alert state where the temperature of the hardware is likely to rise enough to affect the photographing, on the basis of the obtained information. The control device controls the photographing so as to suppress temperature rise of the hardware according to the detection of the occurrence of the alert state.

According to a second aspect of the invention, a magnetic resonance imaging apparatus performs photographing by magnetic resonance imaging using a gradient magnetic field coil, which is supplied with electric power and generates a gradient magnetic field, and a gradient magnetic field amplifier, which supplies the electric power to the gradient magnetic field coil. The magnetic resonance imaging apparatus includes a cooling device, an obtaining device, and four devices.

The cooling device cools a cooling medium used to cool the gradient magnetic field coil and the gradient magnetic field amplifier. The obtaining device obtains at least one of the temperature of the cooling medium cooled by the cooling device, the temperature of the cooling medium having been used to cool the gradient magnetic field coil, the temperature of the cooling medium having been used to cool the gradient magnetic field amplifier, and a value of current supplied to the gradient magnetic field coil by the gradient magnetic field amplifier. One of the four devices detects the occurrence of an alert state according to a fact that any one of the values obtained by the obtaining device exceeds a first threshold value, and the first threshold value is defined so as to correspond to each of the values. Another thereof controls the photographing so as to suppress temperature rise of the gradient magnetic field coil and the gradient magnetic field amplifier according to the detection of the occurrence of the alert state. The third thereof detects the occurrence of a limit state according to a fact that any one of the values obtained by the obtaining device exceeds a second threshold value, and the second threshold value is defined so as to correspond to each of the values and be larger than the first threshold value. The other thereof temporarily stops the photographing according to the detection of the occurrence of the limit state.

According to a third aspect of the invention, a magnetic resonance imaging method performs photographing by magnetic resonance imaging using hardware of which temperature is likely to rise due to a photographing operation. The magnetic resonance imaging method includes obtaining information, which provides an indication of temperature of the hardware, during the photographing; detecting the occurrence of an alert state where the temperature of the hardware is likely to rise enough to affect the photographing, on the basis of the obtained information; and controlling the photographing so as to suppress temperature rise of the hardware according to the detection of the occurrence of the alert state.

According to a fourth aspect of the invention, there is provided a magnetic resonance imaging method of a magnetic resonance imaging apparatus. The magnetic resonance imaging apparatus performs photographing by magnetic resonance imaging using a gradient magnetic field coil that is supplied with electric power and generates a gradient magnetic field, and a gradient magnetic field amplifier that supplies the electric power to the gradient magnetic field coil. The magnetic resonance imaging method includes obtaining at least one of the temperature of the cooling medium cooled by the cooling device, the temperature of the cooling medium having been used to cool the gradient magnetic field coil, the temperature of the cooling medium having been used to cool the gradient magnetic field amplifier, and a value of current supplied to the gradient magnetic field coil by the gradient magnetic field amplifier; detecting the occurrence of an alert state according to a fact that any one of the obtained values exceeds a first threshold value that is defined so as to correspond to each of the values; controlling the photographing so as to suppress temperature rise of the gradient magnetic field coil and the gradient magnetic field amplifier according to the detection of the occurrence of the alert state; detecting the occurrence of a limit state according to a fact that any one of the obtained values exceeds a second threshold value that is defined so as to correspond to each of the values and be larger than the first threshold value; and temporarily stopping the photographing according to the detection of the occurrence of the limit state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DESCRIPTION OF THE PREFERRED EMBODIMENTS

An embodiment of the invention will be described below with reference to accompanying drawings.

Figure 1:
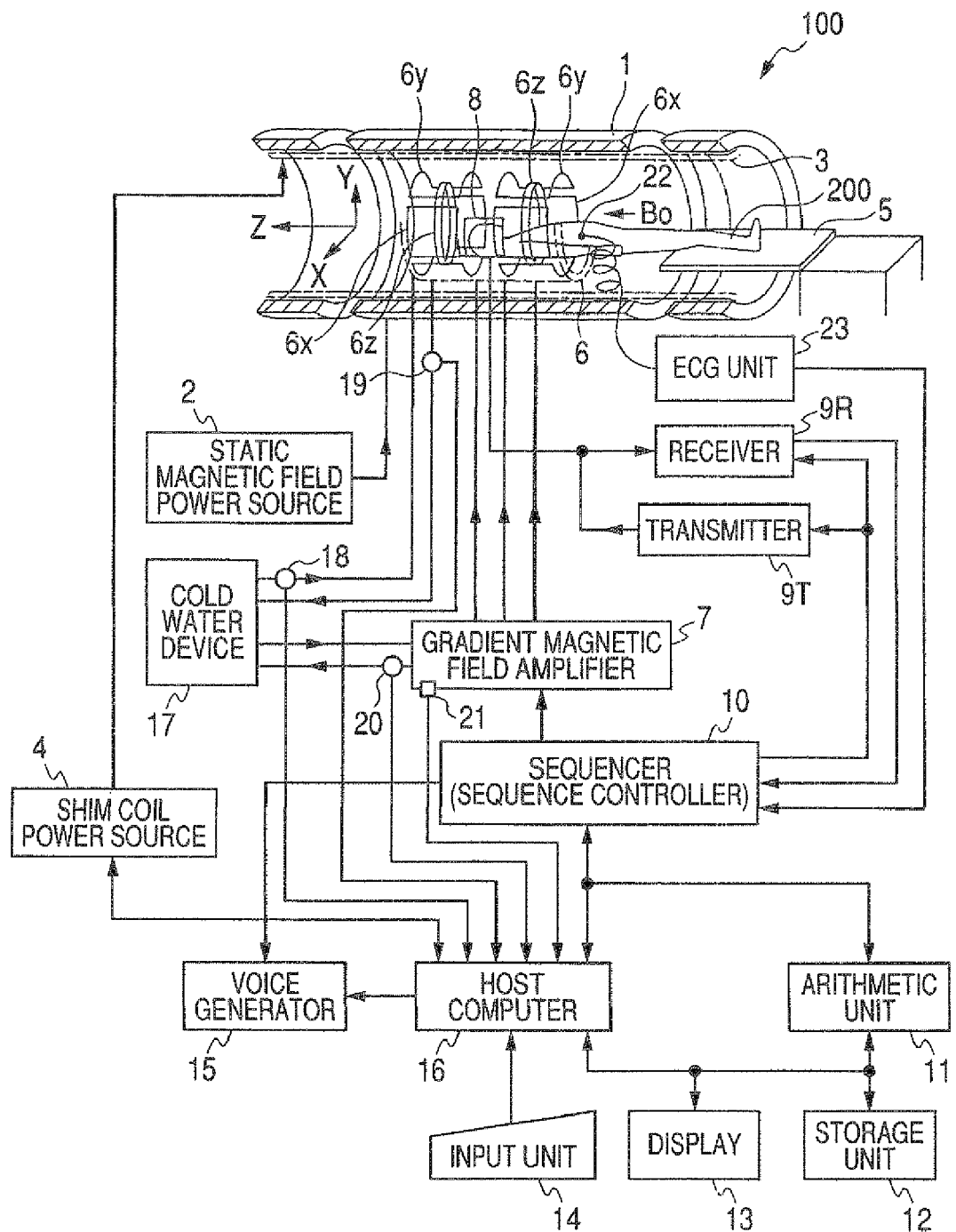
FIG. 1 is a view showing the schematic structure of a magnetic resonance imaging apparatus (MRI apparatus) 100 according to an embodiment of the invention.

FIG. 1 is a view showing the schematic structure of a magnetic resonance imaging apparatus (MRI apparatus) 100 according to this embodiment.

The MRI apparatus 100 includes a bed on which a subject 200 is placed, a static magnetic field generating device that generates a static magnetic field, a gradient magnetic field generating device that adds position information to the static magnetic field, a transmitting-receiving device that transmits and receives a high-frequency signal, a control-arithmetic device that performs the control of the entire system and image reconstruction, a cooling device that cools the gradient magnetic field generating device, and an information obtaining device that obtains temperature information about the gradient magnetic field generating device. Further, as components of each of the devices, the MAR apparatus 100 includes a magnet 1, a static magnetic field power source 2, a shim coil 3, a shim coil power source 4, a top panel 5, a gradient magnetic field coil unit 6, a gradient magnetic field amplifier 7, an RF coil unit 8, a transmitter 9T, a receiver 9R, a sequencer (sequence controller) 10, an arithmetic unit 11, a storage unit 12, a display 13, an input unit 14, a voice generator 15, a host computer 16, a cold water device 17, temperature sensors 18, 19, and 20, and a current monitor 21. Furthermore, an electrocardiograph device, which measures an ECG signal used as a signal representing a cardiac time phase of the subject 200, is connected to the MRI apparatus 100.

The static magnetic field generating device includes the magnet 1 and the static magnetic field power source 2. For example, a superconducting magnet or a normal conducting magnet may be used as the magnet 1. The static magnetic field power source 2 supplies current to the magnet 1. Accordingly, the static magnetic field generating device generates a static magnetic field $B_0$ in a cylindrical space (diagnostic space) into which the subject 200 is moved. The magnetic field direction of the static magnetic field $B_0$ substantially corresponds to an axial direction of the diagnostic space (Z-axis direction). The static magnetic field generating device further includes a shim coil 3. The shim coil 3 generates a correcting magnetic field that makes the static magnetic field be uniform by the current supplied from the shim coil power source 4 under the control of the host computer 16.

The bed moves the top panel 5, on which the subject 200 is placed, into the diagnostic space or moves the top panel from the diagnostic space.

The gradient magnetic field generating device includes the gradient magnetic field coil unit 6 and the gradient magnetic field amplifier 7. The gradient magnetic field coil unit 6 is disposed in the magnet 1. The gradient magnetic field coil unit 6 is provided with three sets of coils 6x, 6y, and 6z for generating gradient magnetic fields in an X-axis direction, a Y-axis direction, and a Z-axis direction that are perpendicular to one another. The gradient magnetic field amplifier 7 supplies pulse current that generates gradient magnetic fields, to the coils 6x, 6y, and 6z under the control of the sequencer 10. Accordingly, the gradient magnetic field generating device synthesize each of the gradient magnetic fields corresponding to the directions of three axes (X, Y, and Z axes) that are physical axes, by controlling the pulse current that is supplied from the gradient magnetic field amplifier 7 to the coils 6x, 6y, and 6z. Further, the gradient magnetic field generating device arbitrarily sets gradient magnetic fields in the directions of the physical axes, which include a gradient magnetic field $G_S$ in a slice direction, a gradient magnetic field $G_E$ in a phase encoding direction, and a gradient magnetic field $G_R$ in a readout direction (frequency encoding direction). Each of the gradient magnetic field $G_S$ in the slice direction, the gradient magnetic field $G_E$ in the phase encoding direction, and the gradient magnetic field $G_R$ in the readout direction overlaps the static magnetic field $B_0$.

The transmitting-receiving device includes the RF coil unit 8, the transmitter 9T, and the receiver 9R. The RF coil unit 8 is disposed near the subject 200 in the diagnostic space. The transmitter 9T and the receiver 9R are connected to the RF coil unit 8. The transmitter 9T and the receiver 9R operate under the control of the sequencer 10. The transmitter 9T supplies an RE current pulse corresponding to Larmor frequency, which causes nuclear magnetic resonance (NMR), to the REF coil unit 8. The receiver 9R receives an MR signal such as an echo signal that is received by the RE coil unit 8, and performs various signal processing, such as preamplification, intermediate frequency conversion, phase detection, low-frequency amplification, and filtering, on the signal. Then, the receiver performs analog-digital conversion to generate digital data (raw data).

The control-arithmetic device includes the sequencer 10, the arithmetic unit 11, the storage unit 12, the display 13, the input unit 14, the voice generator 15, and the host computer 16.

The sequencer 10 is provided with a CPU and a memory. The sequencer 10 stores pulse sequence information, which is sent from the host computer 16, in the memory. The CPU of the sequencer 10 controls the operation of the gradient magnetic field amplifier 7, the transmitter 9T, and the receiver 9R according to the pulse sequence information stored in the memory. Further, the CPU inputs the raw data output from the receiver 9R once, and then transmits the raw data to the arithmetic unit 11. In this case, the sequence information is the entire information that is required for operating the gradient magnetic field amplifier 7, the transmitter 9T, and the receiver 9R according to a series of pulse sequences. For example, the sequence information includes information about the intensity, applying time, and applying timing of the pulse current that is applied to the coils 6x, 6y, and 6z. The sequence information includes information that is required for accomplishing diffusion weighted imaging according to a DWI (diffusion weighted imaging) sequence.

The arithmetic unit 11 inputs the raw data, which is output from the receiver 9R, through the sequencer 10. The arithmetic unit 11 disposes the input raw data in a k space (which is called a Fourier space or a frequency space) set in an internal memory, and performs two-dimensional or three-dimensional Fourier transformation on the data disposed in the k space in order to reconstruct the image data of a real space. Further, the arithmetic unit 11 may also perform synthesis processing or differential calculation processing (which includes weighted differential processing) of data related to an image, if necessary. The synthesis processing includes processing for adding a pixel value to each pixel, maximum intensity projection (MIP) processing, and the like. Further, another example of the synthesis processing may include matching axes of a plurality of frames in the Fourier space, and synthesizing the raw data of the plurality of frames to obtain raw data of one frame. Meanwhile, addition processing includes simple addition processing, addition-average processing, weighted addition processing, and the like.

The storage unit 12 stores the reconstructed image data or image data on which the synthesis processing or the differential processing has been performed.

The display 13 displays various images, which are to be provided to a user, under the control of the host computer 16. A display device such as a liquid crystal display may be used as the display 13.

The input unit 14 inputs various information, such as parameter information used to select synchronization timing desired by an operator, scanning conditions, pulse sequences, and information about image synthesis or differential calculation. The input unit 14 sends the input information to the host computer 16. A pointing device such as a mouse or a trackball, a selection device such as a mode switch, or an input device such as a keyboard may be appropriately provided as the input unit 14.

The voice generator 15 generates messages corresponding to breath-holding beginning and breath-holding end in the form of voice when there is an instruction from the host computer 16.

The host computer 16 has various functions that are accomplished by executing a predetermined software procedure. One of the functions is to instruct pulse sequence information to the sequencer 10 and to control the operation of the entire apparatus. Another of the functions is to detect the occurrence of an alert state where the temperature of the gradient magnetic field coil unit 6 or the gradient magnetic field amplifier 7 is likely to rise enough to affect the photographing, on the basis of the temperature information obtained by the information obtaining device. The third of the functions is to control the photographing so as to suppress the temperature rise of the gradient magnetic field coil unit 6 or the gradient magnetic field amplifier 7 according to the detection of the occurrence of the alert state. The fourth of the functions is to detect the occurrence of a limit state where the temperature of the gradient magnetic field coil unit 6 or the gradient magnetic field amplifier 7 rises enough to affect the photographing, on the basis of the temperature information obtained by the information obtaining device. The other of the functions is to temporarily stop the photographing according to the detection of the occurrence of the limit state.

The cooling device includes a cold water device 17. The cold water device 17 cools cooling water. The cooling water flows from the cold water device 17 into a conduit that is disposed to pass through the gradient magnetic field coil unit 6 and the gradient magnetic field amplifier 7. The cooling water, which is heated after cooling the gradient magnetic field coil unit 6 and the gradient magnetic field amplifier 7, returns to the cold water device 17 through the conduit.

The information obtaining device includes the temperature sensor 18, 19, and 20 and the current monitor 21. The temperature sensor 18 detects the temperature of the cooling water flowing from the cold water device 17. The temperature sensor 19 detects the is temperature of the cooling water flowing from the gradient magnetic field coil unit 6. The temperature sensor 20 detects the temperature of the cooling water flowing from the gradient magnetic field amplifier 7. The current monitor 21 monitors the value of the current that is output from the gradient magnetic field amplifier 7 to the gradient magnetic field coil unit 6, and calculates a feature value of current for a recent predetermined period (for example, for 1 minute). A square integration value or an absolute value may be used as the feature value. The temperature sensors 18, 19, and 20 provide detected temperature to the host computer 16 as the temperature information, and the current monitor 21 provides the monitored feature value to the host computer 16 as the temperature information. Meanwhile, the temperature detected by the temperature sensor 18 is used as information representing how much the gradient magnetic field coil unit 6 and the gradient magnetic field amplifier 7 are cooled by the cooling water. The temperature detected by the temperature sensor 19 is used as information representing how much the cooling water is heated by the gradient magnetic field coil unit 6. The temperature detected by the temperature sensor 20 is used as information representing how much the cooling water is heated by the gradient magnetic field amplifier 7. The feature value calculated by the current monitor 21 is used as information representing the amount of heat generated when the gradient magnetic field amplifier 7 generates pulse current and the amount of heat generated when the gradient magnetic field coil unit 6 generates a gradient magnetic field. Therefore, the temperature information provides an indication of the temperature of the gradient magnetic field coil unit 6 and the gradient magnetic field amplifier 7.

The electrocardiograph device includes an ECG sensor 22 and an ECG unit 23. The ECG sensor 22 is attached to the body surface of the subject 200, and detects an ECG signal of the subject 200 in the form of an electrical signal (hereinafter, referred to as a sensor signal). The ECG unit 23 performs various processing including digitization processing of the sensor signal, and then outputs the signal to the host computer 16 and the sequencer 10. For example, a vector electrocardiograph may be used as the electrocardiograph device. When the scanning synchronized with the cardiac time phase of the subject 200 is performed, the sensor signal of the electrocardiograph device is used in the sequencer 10 if necessary.

The operation of the MRI apparatus 100 having the above-mentioned structure will be described below.

The MRI apparatus 100 can perform photographing in various sequences that are accomplished in an existing MRI apparatus, but the description thereof will be omitted. Further, the operation, which is related to the temperature management of the gradient magnetic field generating device when the photographing is performed, will be described herein. Meanwhile, the temperature management may be performed regardless of the sequence where the photographing is performed, and may be performed only when photographing is performed in a specific sequence, that is, a sequence where a large load is applied to a gradient magnetic field, such as DWI.

Figure 2:
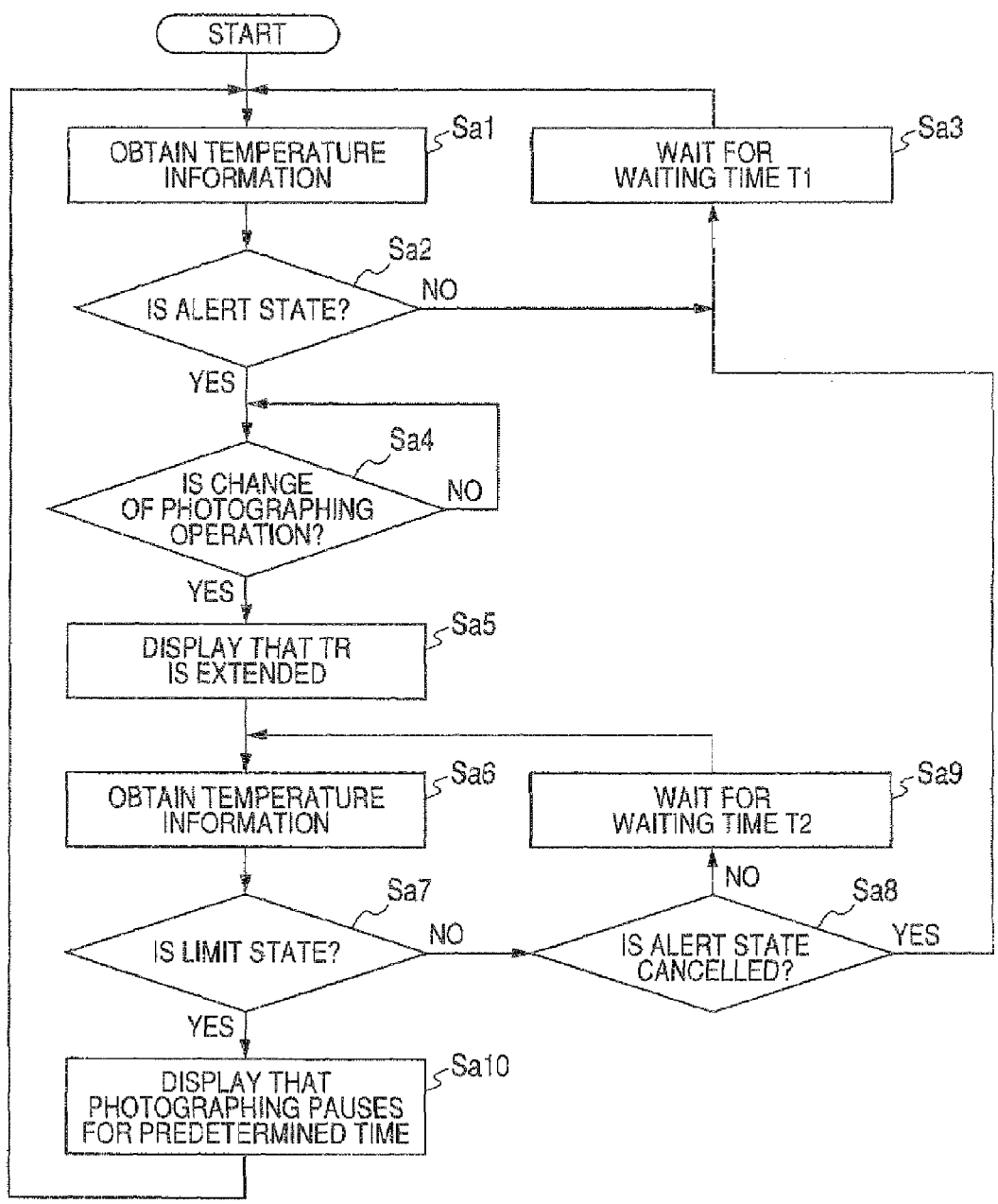
FIG. 2 is a flowchart illustrating the processing of a host computer 16 that is related to the temperature management of a gradient magnetic field generating device, when photographing is performed.

When the photographing begins to be performed, the host computer 16 begins to perform the processing shown in FIG. 2 while keeping pace with this.

In Step Sa1, the host computer 16 obtains temperature information from each of the temperature sensors 18, 19, and 20 and the current monitor 21. In Step Sa2, the host computer 16 confirms whether the gradient magnetic field generating device is in an alert state on the basis of the temperature information obtained in Step Sa1. When at least one of the following conditions (1) to (4) is satisfied, the host computer 16 determines that the gradient magnetic field generating device is in the alert state.

$$\text{sum\_crt\_wng1} \leq \text{sum\_crt} \qquad (1)$$

$$\text{amptmp\_out\_wng1} \leq \text{amptmp\_out} \qquad (2)$$

$$\text{coiltmp\_out\_wng1} \leq \text{coiltmp\_out} \qquad (3)$$

$$\text{chillertmp\_out\_wng1} \leq \text{chillertmp\_out} \qquad (4)$$

In this case, sum_crt indicates a feature value calculated in the current monitor 21, amptmp_out indicates temperature detected by the temperature sensor 20, coiltmp_out indicates temperature detected by the temperature sensor 19, chillertmp_out indicates temperature detected by the temperature sensor 18, sum_crt_wng1 indicates an alert value of the feature value sum_crt, amptmp_out_wng1 indicates an alert value of the temperature amptmp_out, coiltmp_out_wng1 indicates an alert value of the temperature coiltmp_out, and chillertmp_out_wng1 indicates an alert value of the temperature chillertmp_out.

If the host computer determines that the gradient magnetic field generating device is not in the alert state, the host computer 16 proceeds from Step Sa2 to Step Sa3. In Step Sa3, the host computer 16 waits for a predetermined waiting time T1. After completely waiting for the waiting time T1, the host computer 16 returns to Step Sa1. Accordingly, if the gradient magnetic field generating device is not in the alert state, the host computer 16 obtains temperature information while repeatedly waiting for an interval of the waiting time T1, and confirms whether the gradient magnetic field generating device is in the alert state.

If the gradient magnetic field generating device is in the alert state, the host computer 16 proceeds from Step Sa2 to Step Sa4. In Step Sa4, the host computer 16 waits until the change of a photographing operation comes. Examples of the change of the photographing operation include the change of an average of averaging scanning, the change of a photographing object slice, the change of a dynamic time phase of dynamic scanning, and the like. Further, if the change of the photographing operation comes, the host computer 16 proceeds from Step Sa4 to Step Sa5. In Step Sa5, the host computer 16 instructs the sequencer 10 to extend repetition time TR in order to extend Duty related to the photographing that is being performed. Accordingly, since the gradient magnetic field generating device is in the alert state, the host computer 16 controls the display 13 so as to display a warning that the TR is extended.

In this case, the extended TR is obtained from, for example, a relational expression between the estimated Duty and temperature rise.

That is, it is possible to obtain the extended TR by the following expression.

$$\text{Extended } TR = \text{Present } TR \times \Delta T/\alpha$$

In this case, $\alpha$ indicates a temperature rise rate (° C./min.) for the past one minute, and $\Delta T$ indicates an alert state-temperature width (limit value-alert value) (° C.) of a parameter exceeding the alert state.

The control of the TR is performed at regular intervals. If the gradient magnetic field generating device is in the alert state, the frequency thereof may be changed.

Further, conditions have been represented herein by simple expressions, but complicated behavior such as a case delay occurs may be represented. Accordingly, an extension factor of the TR may be determined with reference to measured data (a historical curve of the pre-measured change). Furthermore, a method of unconditionally multiplying the TR by a fixed value may be used as a method of dynamically controlling the TR. In addition, since the detection is performed using heat, delay caused by heat transfer may be added.

In Step Sa6, the host computer 16 obtains temperature information from each of the temperature sensors 18, 19, and 20 and the current monitor 21. Subsequently, in Steps Sa7 and Sa8, the host computer 16 confirms whether the gradient magnetic field generating device is in a limit state and the alert state is cancelled or not, on the basis of the temperature information obtained in Step Sa6. When at least one of the following conditions (5) to (8) is satisfied, the host computer 16 determines that the gradient magnetic field generating device is in the limit state.

$$\text{sum\_crt} > \text{sum\_crt\_th} \qquad (5)$$

$$\text{amptmp\_out} > \text{amptmp\_out\_th} \qquad (6)$$

$$\text{coiltmp\_out} > \text{coiltmp\_out\_th} \qquad (7)$$

$$\text{chillertmp\_out\_} > \text{chillertmp\_out\_th} \qquad (8)$$

In this case, sum_crt_th indicates a limit value of the feature value sum_crt, amptmp_out_th indicates a limit value of the temperature amptmp_out, coiltmp_out_th indicates a limit value of the temperature coiltmp_out, and chillertmp_out_th indicates a limit value of the temperature chillertmp_out.

Further, when all of the following conditions (9) to (12) are satisfied, the host computer 16 determines that the alert state is cancelled.

$$\text{sum\_crt\_wng2} > \text{sum\_crt} \qquad (9)$$

$$\text{amptmp\_out\_wng2} > \text{amptmp\_out} \qquad (10)$$

$$\text{coiltmp\_out\_wng2} > \text{coiltmp\_out} \qquad (11)$$

$$\text{chillertmp\_out\_wng2} > \text{chillertmp\_out} \qquad (12)$$

In this case, sum_crt_wng2 indicates an alert-cancellation value of the feature value sum_crt, amptmp_out_wng2 indicates an alert-cancellation value of the temperature amptmp_out, coiltmp_out_wng2 indicates an alert-cancellation value of the temperature coiltmp_out, and chillertmp_out_wng2 indicates an alert-cancellation value of the temperature chillertmp_out.

Meanwhile, an alert value, a limit value, and an alert-cancellation valuer which correspond to the same temperature information, have a relationship "limit value>alert value>alert-cancellation value". The limit value is set to a value where the temperature of the gradient magnetic field coil unit 6 or the gradient magnetic field amplifier 7 is likely to rise enough to affect the photographing when corresponding temperature information reaches the limit value. The alert value is set to a value that is obtained by deducting an appropriate margin from the limit value. The alert-cancellation value is set to a value that is obtained by deducting an appropriate margin from the alert value. The limit value, the alert value, and the alert-cancellation value may be appropriately set on the basis of results of, for example, experiments or simulations.

If the host computer determines that the gradient magnetic field generating device is not in the limit state and the alert state is not cancelled, the host computer 16 proceeds from Step Sa8 to Step Sa9. In Step Sa9, the host computer 16 waits for a predetermined waiting time T2. After completely waiting for the waiting time T2, the host computer 16 returns to Step Sa6. Accordingly, the host computer 16 obtains temperature information in the alert state while repeatedly waiting for an interval of the waiting time T2, and confirms whether the gradient magnetic field generating device is in the limit state and the alert state is cancelled or not. Meanwhile, if the gradient magnetic field generating device is in the limit state, it is preferable to quickly determine that the gradient magnetic field generating device is in the limit state. For this reason, it is preferable that the waiting time T2 be shorter than the waiting time T1.

If the host computer determines that the alert state is cancelled, the host computer 16 proceeds from Step Sa8 to Step Sa3 and waits for the waiting time T1. In this case, the host computer 16 displays the states of items exceeding the alert value or the remaining time of the waiting time T1 on the display 13 in real time. Further, after completely waiting for the waiting time T1, the host computer 16 returns to Step Sa1.

Meanwhile, if the host computer determines that the gradient magnetic field generating device is in the limit state, the host computer 16 proceeds from Step Sa7 to Step Sa10. In Step Sa1, the host computer 16 instructs the sequencer 10 so as to make the photographing pause for a predetermined time. Accordingly, since the gradient magnetic field generating device is in the limit state, the host computer 16 controls the display 13 so as to display a warning that the photographing pauses. If the photographing is resumed after the completion of the pause of the photographing, the host computer 16 returns to Step Sa1. Like the extension of the TR, the pause of the photographing may also be performed to coincide with the change of the photographing operation. Further, the change of the photographing operation where the photographing pauses may be the change of the pattern of the application of the MPG (motion probing gradient) pulse in the DWI sequence. Accordingly, it is possible to make the photographing quickly pause as compared to when waiting until the change of the average or slice comes.

Meanwhile, the host computer 16 finishes the above-mentioned processing according to the completion of the photographing.

As described above, according to the MRI apparatus 100, temperature information, which provides an indication of the temperature of the gradient magnetic field coil unit 6 and the gradient magnetic field amplifier 7, is obtained during the photographing. Further, the TR is extended according to the detection, which is based on the temperature information, of the occurrence of the alert state where the temperature of the gradient magnetic field coil unit 6 and the gradient magnetic field amplifier 7 is likely to rise enough to affect the photographing, so that the temperature rise of the gradient magnetic field coil unit 6 and the gradient magnetic field amplifier 7 is suppressed. Therefore, while preventing the gradient magnetic field generating device from being in the limit state where the temperature of the gradient magnetic field coil unit 6 and the gradient magnetic field amplifier 7 rises enough to affect the photographing as much as possible, it is possible to efficiently perform the photographing by utilizing the gradient magnetic field coil unit 6 and the gradient magnetic field amplifier 7 in maximum.

According to this embodiment, if the occurrence of the limit state is detected even though the TR is extended, the photographing pauses for a predetermined time so as to lower the temperature of the gradient magnetic field coil unit 6 and the gradient magnetic field amplifier 7 and is then resumed. Therefore, while inappropriate photographing is not performed in the limit state and the photographing performed before the limit state is not wasted, it is possible to significantly efficiently perform the photographing.

Meanwhile, the extension of the TR or the pause of the photographing is performed at the change of the photographing operation, such as the change of an average of averaging scanning or the change of a photographing object slice. Therefore, it is possible to suppress the change of the photographing quality, which is caused by performing the extension of the TR or the pause of the photographing, to the maximum extent.

Further, according to this embodiment, when the TR is extended or when the photographing pauses, the display 13 display a warning that the TR is extended or the photographing pauses. Therefore, it is possible to allow a user to perceive that the above-mentioned control is performed.

This embodiment may have the following various modifications.

The occurrence of the limit state may be detected by integrating and evaluating a plurality of conditions. For example, each of sum_crt, amptmp_out, coiltmp_out, and chillertmp_out is evaluated using a numerical value such as 0 (normal level) or 1 (alert level), and the occurrence of the limit state may be detected if the sum of the evaluated values thereof is 2.

Information, which provides an indication of the temperature of hardware, may be only a part of the above-mentioned four kinds of the information, and may include, for example, separate information such as the temperature of a liner tube. Alternatively, the above-mentioned four kinds of the information are not used, and, for example, separate Information such as the temperature of a liner tube may be used.

The hardware, which is used as an object of which temperature is monitored, may be any one of the gradient magnetic field coil unit 6 and the gradient magnetic field amplifier 7, and may include, for example, separate hardware such as the shim coil 3. Alternatively, the gradient magnetic field coil unit 6 and the gradient magnetic field amplifier 7 are not used as an object, and, for example, another hardware such as the shim coil 3 may be used as an object of which temperature is monitored. In addition, the hardware, which is used as an object of which temperature is monitored, may be the RE Coil unit 8. If separate RF coils are used as transmitting and receiving RF coils, respectively, the RF coils may also be used as hardware that is used as an object of which temperature is monitored.

It is possible to arbitrarily apply various controls, which reduce the addition of hardware used as an object of which temperature is monitored, as the control of the photographing in the alert state. For example, the control may include the reduction of an average of averaging scanning or the reduction of a photographing object slice.

When photographing conditions are changed in the alert state or the limit state, the host computer 16 may generate information displaying the change of the photographing conditions as the additional information of data obtained by the photographing. Meanwhile, the additional information only needs to inform the change of the photographing conditions. However, it is preferable that the additional information inform changed photographing conditions. The additional information may be generated for each image, each series, or each study. Due to the generation of the additional information, when observing images, a user can perceive the change of the photographing conditions during the photographing of the corresponding image or the changed photographing conditions. Meanwhile, if the additional information is generated for each series or each study, a warning may always be displayed on the basis of the additional information during the display of each image of the corresponding series or study. However, if a warning is displayed on the basis of the additional information only prior to the display of the initial image of the corresponding series or study, a warning is always displayed during the display of each image, so that it is possible to prevent a user from being troubled.

The cold water device 17 is not mounted on the MRI apparatus 100 and may also be separately formed. In this case, the cold water device 17 may be used for another purpose in addition to the cooling of the MRI apparatus 100. If the cold water device 17 is used for other purposes, there is a concern that the capacity for cooling the gradient magnetic field coil unit 6 and the gradient magnetic field amplifier 7 deteriorates. For this reason, the invention is more useful.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus that performs photographing by magnetic resonance imaging using hardware of which temperature is likely to rise due to a photographing operation, the magnetic resonance imaging apparatus comprising:
   an obtaining device that obtains information providing an indication of temperature of the hardware during the photographing;
   an alert state detecting device that detects the occurrence of an alert state where the temperature of the hardware is likely to rise enough to affect the photographing, on the basis of the obtained information; and
   a control device that controls the photographing so as to suppress temperature rise of the hardware according to the detection of the occurrence of the alert state.

2. The magnetic resonance imaging apparatus according to claim 1,
   wherein the hardware is at least one of a gradient magnetic field coil that is supplied with current and generates a gradient magnetic field, a gradient magnetic field amplifier that supplies the current to the gradient magnetic field coil, a high-frequency coil that is supplied with current and generates a high-frequency magnetic field, and a high-frequency coil that receives a magnetic resonance signal and generates current.

3. The magnetic resonance imaging apparatus according to claim 2,
   wherein the obtaining device obtains a value of current, which is supplied to the gradient magnetic field coil by the gradient magnetic field amplifier, as the information.

4. The magnetic resonance imaging apparatus according to claim 1,
   wherein the hardware is cooled by a cooling medium that is cooled by a cooling device, and
   the obtaining device obtains at least one of the temperature of the cooling medium that is cooled by the cooling device and the temperature of the cooling medium that has been used to cool the hardware, as the information.

5. The magnetic resonance imaging apparatus according to claim 1,
   wherein the obtaining device obtains a numerical value, which provides an indication of the temperature of the hardware, as the information, and
   when the numerical value obtained as the information exceeds a threshold value, the alert state detecting device detects the occurrence of the alert state.

6. The magnetic resonance imaging apparatus according to claim 1,
   wherein the control device extends repetition time of a sequence of the photographing in order to suppress the temperature rise of the hardware.

7. The magnetic resonance imaging apparatus according to claim 1,
   wherein the control device controls the magnetic resonance imaging so as to suppress the temperature rise of the hardware at the change of an average of averaging scanning or the change of a photographing object slice.

8. The magnetic resonance imaging apparatus according to claim 1, further comprising:
   a limit state detecting device that detects the occurrence of a limit state where the temperature of the hardware rises enough to affect the photographing, on the basis of the obtained information; and
   a device that temporarily stops the photographing according to the detection of the occurrence of the limit state.

9. The magnetic resonance imaging apparatus according to claim 8,
   wherein the obtaining device obtains a numerical value, which provides an indication of the temperature of the hardware, as the information, and
   when the numerical value obtained as the information exceeds a threshold value, the limit state detecting device detects the occurrence of the limit state.

10. The magnetic resonance imaging apparatus according to claim 1, further comprising:
    an information device informing a user that the photographing is controlled by the control device to suppress the temperature rise of the hardware.

11. The magnetic resonance imaging apparatus according to claim 1, further comprising:
    a device that generates additional information representing the control of data obtained by the photographing, which is controlled by the control device so as to suppress the temperature rise of the hardware.

12. A magnetic resonance imaging apparatus that performs photographing by magnetic resonance imaging using a gradient magnetic field coil, which is supplied with electric power and generates a gradient magnetic field, and a gradient magnetic field amplifier, which supplies the electric power to the gradient magnetic field coil, the magnetic resonance imaging apparatus comprising:

a cooling device that cools a cooling medium used to cool the gradient magnetic field coil and the gradient magnetic field amplifier;

an obtaining device that obtains at least one of the temperature of the cooling medium cooled by the cooling device, the temperature of the cooling medium having been used to cool the gradient magnetic field coil, the temperature of the cooling medium having been used to cool the gradient magnetic field amplifier, and a value of current supplied to the gradient magnetic field coil by the gradient magnetic field amplifier;

a device that detects the occurrence of an alert state according to a fact that any one of the values obtained by the obtaining device exceeds a first threshold value, the first threshold value being defined so as to correspond to each of the values;

a device that controls the photographing so as to suppress temperature rise of the gradient magnetic field coil and the gradient magnetic field amplifier according to the detection of the occurrence of the alert state;

a device that detects the occurrence of a limit state according to a fact that any one of the values obtained by the obtaining device exceeds a second threshold value, the second threshold value being defined so as to correspond to each of the values and be larger than the first threshold value; and a device that temporarily stops the photographing according to the detection of the occurrence of the limit state.

13. A magnetic resonance imaging method that performs photographing by magnetic resonance imaging using hardware of which temperature is likely to rise due to a photographing operation, the magnetic resonance imaging method comprising:

obtaining information, which provides an indication of temperature of the hardware, during the photographing;

detecting the occurrence of an alert state where the temperature of the hardware is likely to rise enough to affect the photographing, on the basis of the obtained information; and controlling the photographing so as to suppress temperature rise of the hardware according to the detection of the occurrence of the alert state.

14. A magnetic resonance imaging method of a magnetic resonance imaging apparatus, the magnetic resonance imaging apparatus performing photographing by magnetic resonance imaging using a gradient magnetic field coil that is supplied with electric power and generates a gradient magnetic field, and a gradient magnetic field amplifier that supplies the electric power to the gradient magnetic field coil, the magnetic resonance imaging method due to the magnetic resonance imaging apparatus including a cooling device cooling a cooling medium for cooling the gradient magnetic field coil and the gradient magnetic field amplifier comprising:

obtaining at least one of the temperature of the cooling medium cooled by the cooling device, the temperature of the cooling medium having been used to cool the gradient magnetic field coil, the temperature of the cooling medium having been used to cool the gradient magnetic field amplifier, and a value of current supplied to the gradient magnetic field coil by the gradient magnetic field amplifier;

detecting the occurrence of an alert state according to a fact that any one of the obtained values exceeds a first threshold value, the first threshold value being defined so as to correspond to each of the values;

controlling the photographing so as to suppress temperature rise of the gradient magnetic field coil and the gradient magnetic field amplifier according to the detection of the occurrence of the alert state;

detecting the occurrence of a limit state according to a fact that any one of the obtained values exceeds a second threshold value, the second threshold value being defined so as to correspond to each of the values and be larger than the first threshold value; and temporarily stopping the photographing according to the detection of the occurrence of the limit state.

* * * * *